US011791231B2

(12) United States Patent
Teng et al.

(10) Patent No.: US 11,791,231 B2
(45) Date of Patent: Oct. 17, 2023

(54) COMPRESSION-LOADED PRINTED CIRCUIT ASSEMBLY FOR SOLDER DEFECT MITIGATION

(71) Applicant: Google LLC, Mountain View, CA (US)

(72) Inventors: Sue Yun Teng, Belmont, CA (US); Shinnosuke Yamamoto, San Francisco, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/525,275

(22) Filed: Nov. 12, 2021

(65) Prior Publication Data

US 2022/0077020 A1 Mar. 10, 2022

Related U.S. Application Data

(63) Continuation of application No. 16/874,194, filed on May 14, 2020, now Pat. No. 11,183,438.

(51) Int. Cl.
| | | |
|---|---|---|
| *H01L 23/32* | (2006.01) | |
| *H02B 1/015* | (2006.01) | |
| *H05K 7/10* | (2006.01) | |

(52) U.S. Cl.
CPC ............. *H01L 23/32* (2013.01); *H02B 1/015* (2013.01); *H05K 7/1007* (2013.01)

(58) Field of Classification Search
CPC .............................. H05K 7/1007; H01L 23/32
See application file for complete search history.

(56) References Cited

U.S. PATENT DOCUMENTS

| 5,400,220 | A | 3/1995 | Swamy | |
|---|---|---|---|---|
| 6,381,136 | B1 * | 4/2002 | Nelson | ..................... H05K 7/20 257/718 |
| 6,700,800 | B2 | 3/2004 | Combs et al. | |
| 8,967,452 | B2 | 3/2015 | Cheung et al. | |

(Continued)

FOREIGN PATENT DOCUMENTS

TW          402830 B          8/2000

OTHER PUBLICATIONS

Extended European Search Report for European Patent Application No. 20211435.1 dated May 19, 2021. 10 pages.

(Continued)

*Primary Examiner* — Ross N Gushi
(74) *Attorney, Agent, or Firm* — Lerner David LLP

(57) ABSTRACT

The present disclosure provides systems for applying a compression load on at least part of an application specific integrated circuit ("ASIC") ball grid array ("BGA") package during the rework or secondary reflow process. The compression-loading assembly may include a top plate and a compression plate. The compression plate may exert a compression load on at least part of the ASIC using one or more compression mechanisms. The compression mechanisms may each include a bolt and a spring. The bolt may releasably couple the top plate to the compression plate and allow for adjustments to the compression load. The spring may be positioned on the bolt between the top plate and the compression plate and, therefore, may exert a force in a direction away from the top plate and toward the compression plate. The compression load may retain the solder joint and may prevent the solder separation defect during the reflow process.

20 Claims, 6 Drawing Sheets

(56) References Cited

U.S. PATENT DOCUMENTS

| | | | |
|---|---|---|---|
| 10,524,348 B1 * | 12/2019 | Chen | H05K 1/0203 |
| 2006/0285297 A1 * | 12/2006 | Conner | H01L 25/105 |
| | | | 257/E25.023 |
| 2013/0224970 A1 | 8/2013 | Sandhu et al. | |
| 2018/0082868 A1 | 3/2018 | Brown et al. | |

OTHER PUBLICATIONS

Office Action for Taiwanese Patent Application No. 109136394 dated Aug. 28, 2023. 11 pages.

\* cited by examiner

COMPRESSION-LOADED PRINTED CIRCUIT ASSEMBLY FOR SOLDER DEFECT MITIGATION

CROSS REFERENCE TO RELATED APPLICATIONS

This application is a continuation of U.S. application Ser. No. 16/874,194, filed on May 14, 2020, the disclosure of which is incorporated herein by reference.

BACKGROUND

Mounting components to a printed circuit board ("PCB") may be done using surface-mount technology ("SMT"). SMT typically requires components to be temporarily attached to contact pads on a first surface of the PCB with a solder paste before the solder paste is heated until it becomes liquid. The liquid then cools into a solid solder joint connecting the components to the contact pads. Heating of the solder paste may be done using reflow soldering where the entire PCB, including the components and solder paste, are heated until the solder paste reflows into a liquid state. Once removed from the heat, the liquid solder forms solid solder joints between the components and the contact pads.

Double-sided printed circuit boards ("PCBs") may have components that have been soldered onto both sides of the PCB using SMT. To attach components to a second side of a PCB, the PCB may be positioned such that the attached components are positioned downwards and additional components may be temporarily attached to contact pads on the surface of the PCB facing upwards with solder paste. The entire PCB may again be subjected to reflow soldering. After completion of the second reflow soldering, the PCB may have components attached to both sides.

BRIEF SUMMARY

Aspects of the disclosure are directed to a compression-load assembly for minimizing and mitigating solder defects and disconnections. In one aspect a compression-loaded assembly for applying a compression force on an application specific integrated circuit ("ASIC") package comprises a top plate, a compression plate, and one or more compression mechanisms coupled to the compression plate and the top plate, wherein the one or more compression mechanisms configured to apply a compression load on an ASIC in a direction away from the top plate towards the compression plate. Each compression mechanism may include a compression member and at least one spring positioned on each compression member. The at least one spring may be located between the compression plate and the top plate.

Each compression member may include a head and a shaft. The compression plate may include one or more counterbores configured to receive the head of the compression member. The compression plate may include one or more throughbores configured to receive the shaft of the compression member. The head of the compression member may be located on a first side of the top plate and the at least one spring is located on a second side of the top plate opposite the first side.

The one or more compression members may be advanced or retracted such that the compression load is adjustable. When the one or more compression mechanisms are advanced the compression load may be increased. When the one or more compression mechanisms are retracted the compression load may be decreased.

The compression-loaded assembly may further comprise one or more coupling mechanisms releasably coupling a printed circuit board ("PCB") and the compression plate. Each of the one or more coupling mechanisms may include an alignment stud and a threaded member. The alignment stud may be integral with the compression plate and may include a threaded bore. The PCB may include at least one PCB throughbore that aligns with the threaded bore of the alignment stud. The at least one PCB throughbore and the threaded bore of the alignment stud may be configured to receive the threaded member.

The one or more compression mechanisms may include at least six compression mechanisms. The at least six compression mechanisms may be distributed on the compression plate. The at least six compression mechanisms may be configured to provide a uniform compression load across the ASIC.

DETAILED DESCRIPTION

The systems and methods described herein are related to a compression-loading assembly that may apply a specified compression load to an ASIC package during soldering to minimize the risk of solder joint failure or defects during solder reflow or rework. During manufacturing of the ASIC package the ASIC package may be soldered to the PCB via a BGA array, such as with top-side SMT. Once soldered, the ASIC package and the PCB may be flipped so that top-side SMT can be used to mount other components via another BGA array on the opposite side of the PCB. To avoid separation of the solder joints between the PCB and the ASIC package during reflow or soldering of the other components the compression-loading assembly may be used to apply pressure on the ASIC package. The compression-loading assembly may apply a compression load on the ASIC package sufficient to prevent the solder joints connecting the ASIC package to the PCB from separating from the PCB or ASIC package or otherwise developing defects.

Figure 1:
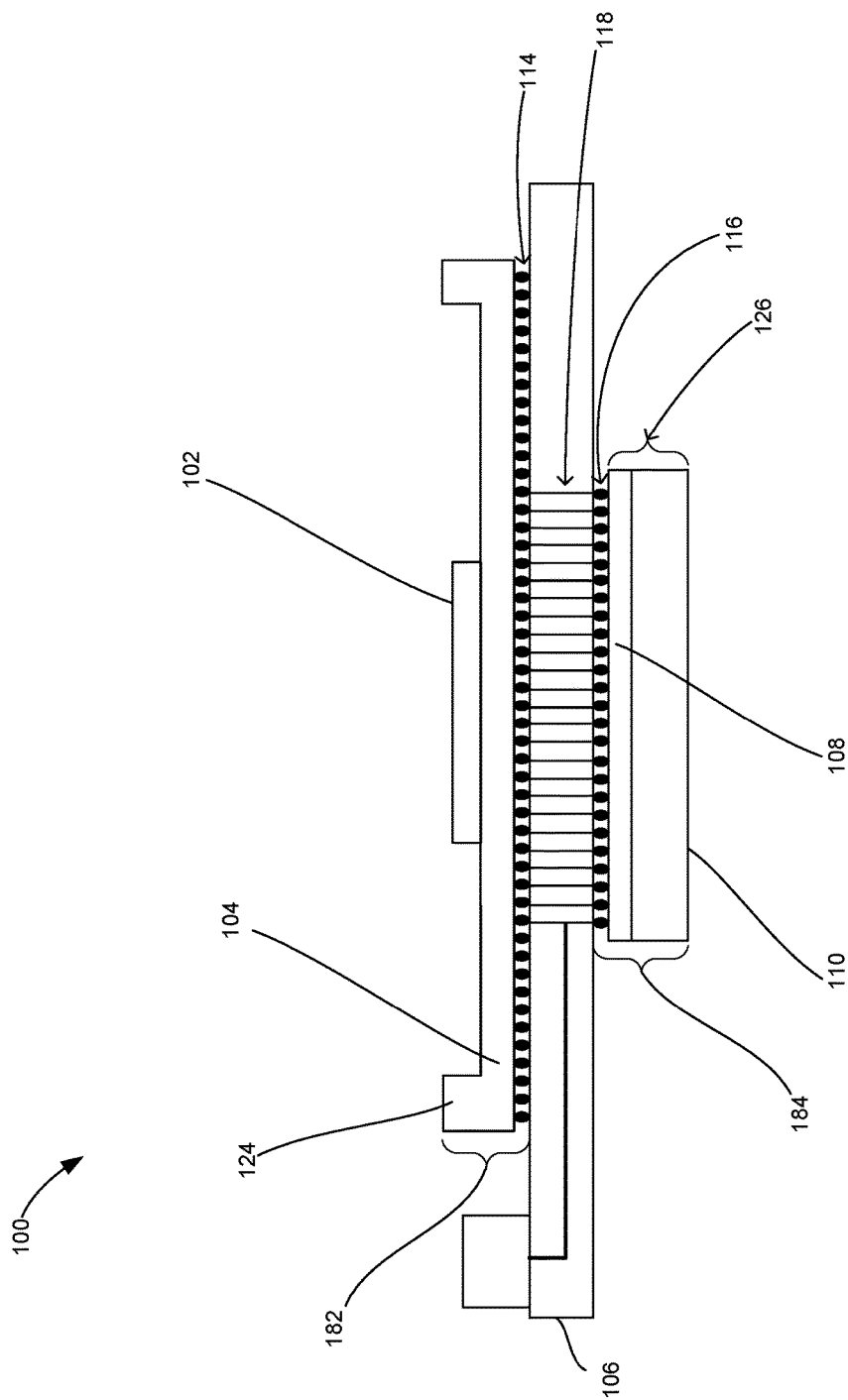
FIG. 1 illustrates a cross-sectional view of an ASIC package according to aspects of the disclosure.

FIG. 1 illustrates an example system 100 in which features described herein may be implemented. As described herein, example system 100 should not be considered limiting to the scope of the disclosure or the usefulness of the features described herein. System 100 may include a first BGA package 182 and a second BGA package 184. The first BGA package 182 may be an ASIC package. The ASIC package may include ASIC die 102, package substrate 104 with a stiffener ring 124, and BGA array 114. The ASIC die 102 may be attached, or otherwise mounted to the package substrate 104. The second BGA package 184 may be a power module BGA package and, in some examples, may include power module 126 and BGA array 116. The power module 126 may include a gearbox 108 and a multichip module ("MCM") 110. Between the first BGA package 182 and the second BGA package 184 may be PCB 106.

The first BGA package 182 and second BGA package 184 may be connected to the PCB 106 by soldering one or more BGA arrays 114, 116. For example, FIG. 1 further shows a first BGA array 114 positioned between package substrate 104 and PCB 106 and a second BGA 116 array positioned between PCB 106 and power module 126. As shown, BGA arrays 114, 116 may align with vias 118. However, in some examples, BGA arrays 114, 116 may not perfectly align such that they are offset from via 118. The package substrate 104 may be coupled to the PCB 106 by soldering the first BGA array 114 and the power module 126 may be coupled to the PCB 106 by soldering the second BGA array 116.

The system 100 of FIG. 1 includes a vertical power delivery ("VPD") assembly where the package substrate 104, with the ASIC die 102 attached, is mounted back to back-to-back with the power module 126 on the PCB 106. Power may then be delivered from the power module 126 to the ASIC package 102 through the PCB 106 via the first and second BGA arrays 114, 116.

Each BGA array 114, 116 may align with a BGA footprint on the PCB 106. The BGA footprint on the PCB 106 may include structures such as, for example, VIPPO, deep-backdrilled VIPPO, and non-VIPPO structures, on or within the PCB 106. These structures may be used to route data from components connected to the BGA packages to other locations and/or components. VIPPO structures are those in which a conductive or non-conductive material fills a via in the PCB 106 between solder joints and/or BGA pads completely. In some examples, the VIPPO structures are plated with copper, which has a high thermal conductivity and a low "out-of-plane" coefficient of thermal expansion ("CTE") as compared with the epoxy laminate of the PCB. Deep-backdrilled VIPPO structures are structures in which a portion of the conductive or non-conductive material is removed from the via in the PCB as well as the copper plating in that portion of the via. This results in a high CTE for the deep-backdrilled VIPPO structure. Non-VIPPO structures are those in which a via is not used to connect solder joints. None-the-less, non-VIPPO structures have a high CTE, as the PCB board beneath. A mismatch of "out-of-plane" or z-axis CTEs between adjacent structures may result in the solder separation defect during the secondary reflow process.

Figure 2C:
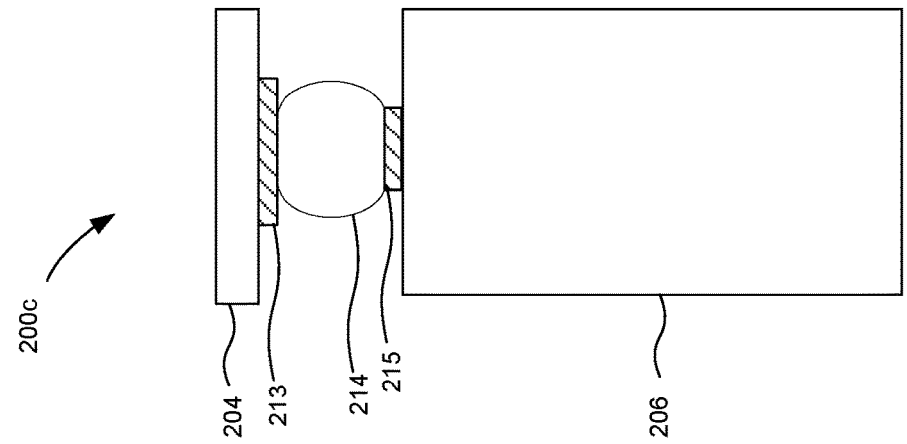
FIG. 2C illustrates a cross-sectional view of a non-VIPPO structure according to aspects of the disclosure.
Figure 2B:
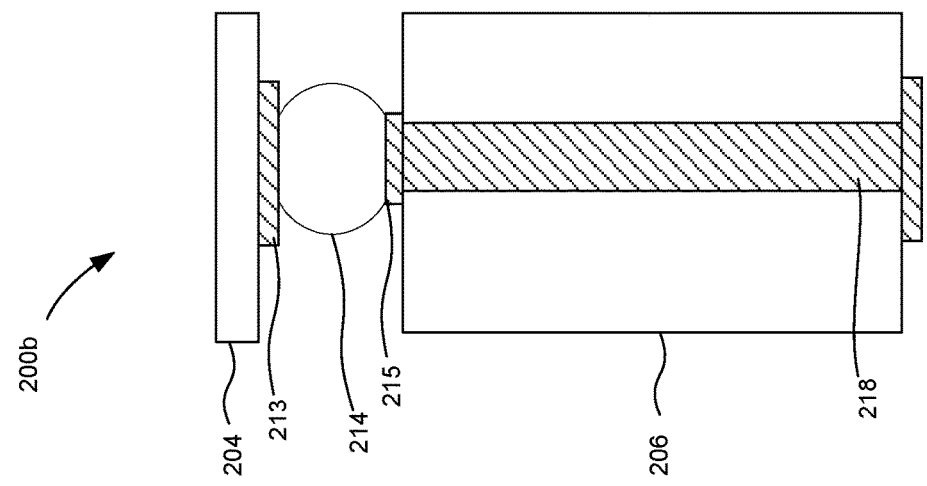
FIG. 2B illustrates a cross-sectional view of a VIPPO structure according to aspects of the disclosure.
Figure 2A:
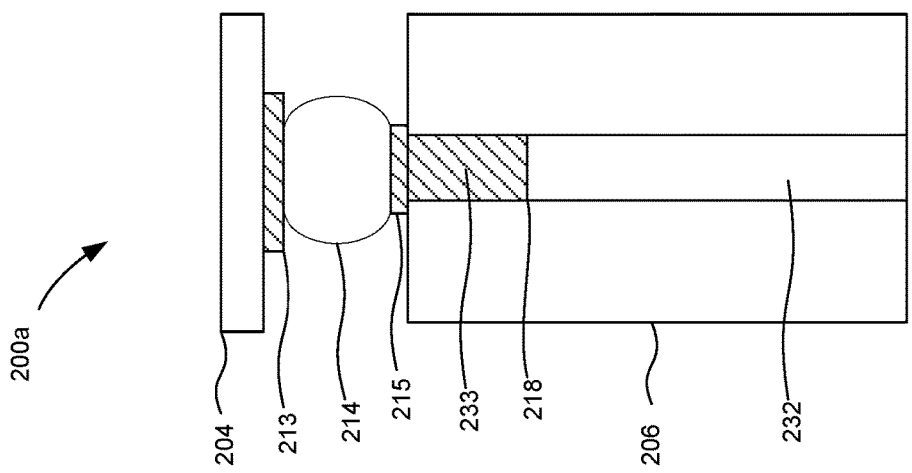
FIG. 2A illustrates a cross-sectional view of deep-back-drilled VIPPO structure according to aspects of the disclosure.

FIGS. 2A-2C illustrates the different structures that the BGA arrays 114, 116 may be associated with. As explained herein, the different structures may each have a different thermal gradient due to the differences in the percentage of copper (or other metal) below the BGA package and/or pad. In some examples, the structures may have a different thermal gradient due to the differences in the material, whether conductive or non-conductive, that otherwise forms the vias, as further discussed herein. According to some examples, the system 100, discussed above, may use a variety of the structures shown and, therefore, a mismatch of the CTE for each solder joint may occur.

Solder joint 214, pad 213, and substrate 204 may be part of the BGA package, similar to the ASIC BGA package 182 discussed above. Pad 215 may be the BGA footprint of PCB 206.

FIG. 2A illustrates a structure 200a at which a solder joint is formed having a deep-backdrilled VIPPO structure. A deep-backdrilled VIPPO structure removes at least a portion of the non-conductive or conductive material of the pad as well as within the via. For example, the via 218 may extend from one end of the PCB 206 to another. As shown in FIG. 2A, a portion 232 of the via 218 and/or the plating within the via 218 may be removed such as by backdrilling. Thus, only a portion 233 of the conductive and/or non-conductive material may remain in via 218. The portion 233 that remains may be coupled to or abut pad 215. Solder joint 214 of BGA array 114, may be located between pad 213 and pad 215. Pad 213 may be coupled to ASIC package 204, or a package substrate to which the ASIC package 204 is attached, and pad 215 may be coupled to PCB 206 and/or the portion 233 of via 218. In some examples, solder joint 214 may be aligned with the via 218 and the portion 233 of the via 218 that has been backdrilled. The deep-backdrilled VIPPO structure may have a high or increased CTE throughout the via 218 and portion 233 of the via that has been removed.

FIG. 2B illustrates a structure 200b of a solder joint using a VIPPO structure. The VIPPO structure is similar to the deep-backdrilled VIPPO structure, but a portion of the via is not removed. Thus, the via 218, and therefore the non-conductive or conductive material within the via 218, extends from one end of the PCB 206 to the other. The via 218 may be coupled to or abut pad 215. Solder joint 214 of BGA array 114, may be located between pad 213 and pad 215. Pad 213 may be coupled to ASIC package 204, or a package substrate to which the ASIC package 204 is attached, and pad 215 may be coupled to PCB 206 and/or via 218. In some examples, solder joint 214 may be aligned with the via 218. The VIPPO structure may have a high thermal conductivity through via 218.

FIG. 2C illustrates a structure 200c of a solder joint with a non-VIPPO structure. Thus, the solder joint does not have a via directly under the PCB pad of the solder joint. This may occur due to a mismatch between adjacent solder joints. For example, if the BGA package is offset from the VIA, the pads 213, 215 and/or solder joint 214 may not align with a via. Thus, the solder joint would not use a VIPPO structure. Nonetheless, the non-VIPPO solder joint may have a high CTE throughout the PCB 206.

Solder defects and separations typically occur when there is an out of plane CTE mismatch below adjacent solder joints associated with VIPPO and non-VIPPO or deep-backdrill VIPPO structures. In some examples, the solder separation occurs when the component is subjected to a secondary reflow, either during top-side SMT for bottom-side components or during rework of an adjacent, or mirrored, BGA component. Additionally or alternatively, the solder separation defect may occur due to the difference thermal gradients of each solder joints having different structures in the PCB underneath the BGA pad of the solder joint. For example, the different thermal gradients may be caused by the percentage of copper below the BGA package pads. Thus, the copper content of each of the VIPPO structures may result in one solder joint becoming liquidus before an adjacent solder joint. In some examples, non-VIPPO joints may remain solid such that as the PCB heats, the non-VIPPO joints expands and pushes the solid solder joints and ASIC upwards. This may cause the liquidus VIPPO solder joints to disconnect. In some examples, the solder joints over the various VIPPO structures may separate between the solder and the intermetallic compound ("IMC") once the solder becomes liquidus.

Figure 3:
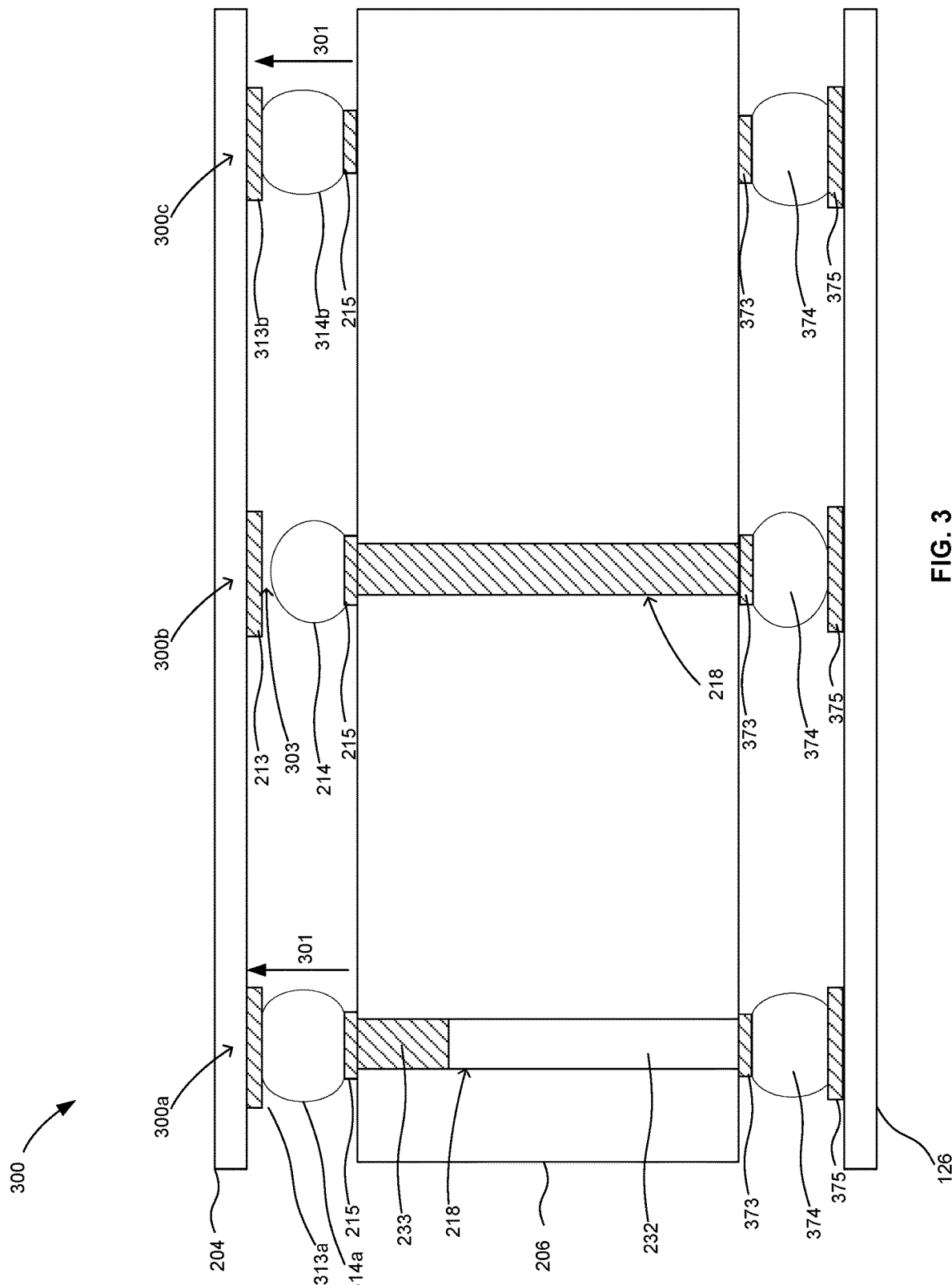
FIG. 3 illustrates a plurality of structures connecting components in an ASIC package according to aspects of the disclosure.

FIG. 3 illustrates a plurality of structures 300 in which solder joints are formed. The plurality of structures may be similar to the structures described with respect to FIGS. 2A-2C. For example, structure 300a may correspond to a deep-backdrilled VIPPO structure, structure 300b may correspond to a VIPPO structure, and structure 300b may correspond to a VIPPO structure, and 300c may correspond to a non-VIPPO structure. Each structure 300a, 300b, 300c may have a different CTE and/or higher thermal conductivity. The differences between the CTE and thermal conductivity between each structure 300a, 300b, 300c may result in the some solder joints becoming liquidus before others. For example, solder joint 214 may become liquidus before solder joints 314a, 314b. As solder joints 314a, 314b may remain solid longer than solder joint 214, there may be greater expansion in deep-backdrilled VIPPO structure 300a and non-VIPPO structure 300c as compared to VIPPO structure 300b. In some examples, during a secondary reflow, this expansion may push the ASIC package 204 upwards, placing a tensile load on solder joint 214. Once solder joint 214 becomes liquidus, while solder joints 314a, 314b remain solid, solder joint 214 may separate from the WIC at either the package pad interface 213 or the PCB pad interface 215.

For example, structure 300 may be flipped such that power module 126 is on top. Structure 300 may be flipped to perform the secondary reflow process. The secondary reflow process may be used to solder joints 374 to BGA pads 373 and, therefore, connect the BGA pads 373 to structures 300a, 300b, 300c. During the secondary reflow process, the tensile loading on the VIPPO solder joint 214 may be due to the expansion of the PCB underneath the adjacent non-VIPPO pads. This expansion may push the ASIC package 204 away from the PCB as solder joints 314a, 314b may still be solid. As ASIC package 204 is pushed away from the PCB, solder joint 214 may be placed under tension as solder joint 214 is being held in place by the VIPPO structure underneath the PCB BGA pad. In some examples, this VIPPO structure has a low "out-of-plane" CTE, which may act as a rivet holding the solder joint down rather than expanding to push it away from the PCB.

Additionally or alternatively, as solder joint 214 has a higher thermal conductivity underneath the PCB pad as compared to solder joints 314a, 314b, solder joint 214 may turn liquidus before adjacent solder joints 314a, 314b. In examples where solder joint 214 is in tension, it may separate from the IMC at either the package pad or the PCB pad. As shown in FIG. 3, solder joint 214 separated from the package pad 213 by a space 303. According to some embodiments, the solder joint 214 may separate from PCB pad 215 and, therefore, the space may be between solder joint 214 and PCB pad 215.

To prevent the solder separation defect, the compression-load assembly may be used after the soldering of the BGA package between the ASIC package and the PCB and during the soldering of the power module to the PCB. Thus, the ASIC package positioned in-between the PCB and a compression plate. One or more compression mechanisms may be coupled to the top plate and compression plate. The one or more compression mechanism may be configured to apply the compression load to the compression plate and, therefore to the ASIC package and the ASIC BGA package, including the solder joints. In some examples, the compression mechanism may include a screw or bolt and at least one spring be positioned on the screw or bolt such that the spring is positioned between the top plate and the compression plate. The screw or bolt may be tightened to adjust the amount of spring force the compression mechanism exerts on the compression plate. Thus, the spring force exerted on the compression plate may transfer to apply a compression load on the ASIC package and the ASIC BGA package. The compression load may be exerted in a direction away from the top plate and toward the compression plate. According to some examples, when the top plate and compression plate are coupled to the PCB, the compression load may be directed toward the PCB.

The compression load may overcome a tension force to prevent the solder separation defect. In some examples, the compression load may be enough to overcome the tension force such that the solder joints are retained during the rework or the secondary reflow process. Additionally, the compression load may not be large enough to deform the solder joint shape or significantly alter the solder stand-off. Stand-off may be the distance between the PCB and ASIC after reflow.

In particular, the metal in the via of the VIPPO structure may have a lower "out-of-plane" CTE than non-VIPPO and deep-backdrilled VIPPO structures. In comparison, non-VIPPO and deep-backdrilled VIPPO structures may have a higher "out-of-plane" CTE than the VIPPO-structure due to less metal, or no metal, being located within the via.

As described above, the solder separation defect may occur when there is a mismatch below adjacent solder joints having VIPPO, non-VIPPO, and/or deep-backdrill VIPPO structures. The solder separation defect may occur due either or both the out-of-plane CTE mismatch and the thermal gradient differences between adjacent solder joints having VIPPO and non-VIPPO or deep backdrilled VIPPO structures.

A compression-loading assembly may apply a compression load that overcomes the tension that typically leads to the solder separation defect. Additionally or alternatively, the compression load may be low enough to not deform the solder joint shape or alter the solder stand-off. In some examples, the compression loading assembly retains the solder during the rework or secondary reflow.

Figure 4:
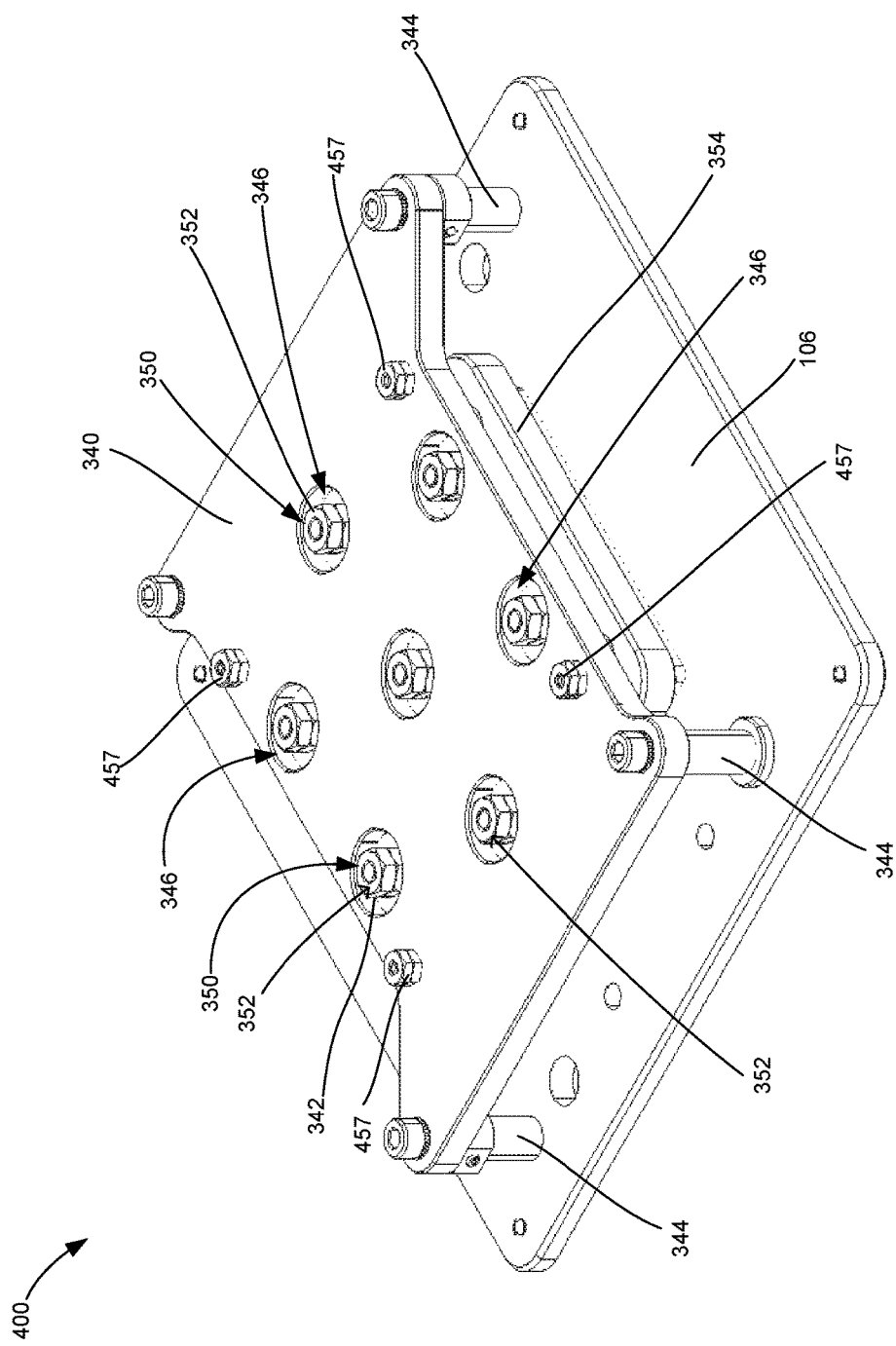
FIG. 4 illustrates a perspective view of a compression-loading assembly according to aspects of the disclosure.

FIG. 4 a compression-loading assembly 400 for applying a compression force on the ASIC package during the reflow process. The compression-loading assembly 400 may be configured to position one or more of the components of the ASIC package described with respect to FIG. 1. In particular, the system may apply a compression load to a BGA package to retain the solder joints between the package and the PCB. For example, the assembly 400 may apply a compression force to the ASIC BGA package 182 during the rework or secondary reflow process. The rework or secondary reflow may occur when the ASIC BGA package 182 is rotated 180 degrees around a horizontal axis of the of the ASIC BGA package 182, or flipped upside down to perform soldering of the second BGA package 184, or power module BGA package, to the PCB.

Compression-loading assembly 400 may include a top plate 340, compression plate 354, PCB 106, one or more compression mechanisms 350, and one or more alignment studs 344. The compression mechanism 350 may include a bolt 352 and a spring (shown in FIG. 4). Assembly 400 may further include a stopping assembly 457. The stopping assembly may include a nut and a bolt. The stopping assembly 457 may provide a hard stop or a maximum compression distance. The stopping assembly may ensure that the springs do not over-compress and, therefore, become damaged.

The top plate 340 may include one or more counterbores 346. Each counterbore 346 may include a throughbore axially aligned with counterbore 346. The counterbore 346 and the throughbore may be configured to receive the bolt 352 of the compression mechanism 350. Each bolt 352 of compression mechanism 350 may include a head 342 and a shaft 464 (shown in FIG. 4). The head 348 of the bolt 352 may fit within counterbore 346. The shaft of bolt 352 may fit within the throughbore. According to some examples, the shaft of bolt 352 may be threaded and the throughbore that receives the shaft of bolt 352 may have threads that mate with the shaft threads. Thus, bolt 352 may be threadably coupled with compression plate 354.

A spring may be positioned on the shaft of each bolt 352. The spring may be located between the top plate 340 and compression plate 354. The springs may exert a force on the compression plate 354 in a direction away from the top plate 340 and towards the compression plate 354. The force exerted by the springs may be evenly distributed throughout compression plate 354 and may result in an evenly distributed force being exerted on the ASIC BGA package 182. According to some examples, the spring force on the compression plate 354 exerts a force on the ASIC BGA package 182 or a component of the ASIC BGA package 182, such as ASIC die 102. Additional or alternatively, the springs may be used to reduce or dampen vibrations during the reflow process.

As shown, there may be seven (7) compression mechanisms 350. However, in some examples there may be six (6) compression mechanisms 350, three (3) compression mechanisms 350, nine (9) compression mechanisms 350, etc. Thus, the seven compression mechanisms 350 shown is merely one example and is not meant to be limiting.

The top plate 340 and, therefore, compression plate 354 may be releasably coupled to PCB 106 via one or more coupling mechanisms. Each coupling mechanism may include an alignment stud 344 and a threaded member. Each alignment stud 344 may be coupled to top plate 340. According to some embodiments, the alignment studs 344 may be integral with top plate 340. The alignment stud 344 may include a threaded bore or a threaded throughbore along the longitudinal axis of the alignment stud 344. The threaded bore of the alignment stud 344 may be configured to receive the threaded member.

A threaded member may be inserted through a bore in PCB 106 to couple PCB 106 and top plate 340. The threaded member may be threaded into the threaded bore of alignment stud 344. Thus, PCB 106 and top plate 340 may be releasably coupled. By coupling PCB 106 and top plate 340, the springs of compression mechanism 350 may compress and, therefore, exert a force on the ASIC package. In particular, the springs may exert a force on compression plate 354, and, therefore, ASIC 102 in the direction of the PCB 106 regardless of the orientation of the compression-loading assembly and ASIC package (i.e., regardless of whether the compression-loading assembly and ASIC package are upright or upside-down). According to some examples, the PCB 106 and top plate 340 may be permanently coupled.

In another example, the assembly 400 may include a bottom plate. In such an example, the top plate 340 and, therefore, compression plate 354 may be releasably coupled to the bottom plate via the one or more coupling mechanisms. The coupling of the top plate 340 and compression plate 354 to the bottom plate may be similar to the coupling of the top plate 340 and compression plate 354 to the PCB 106, as described above.

Figure 5:
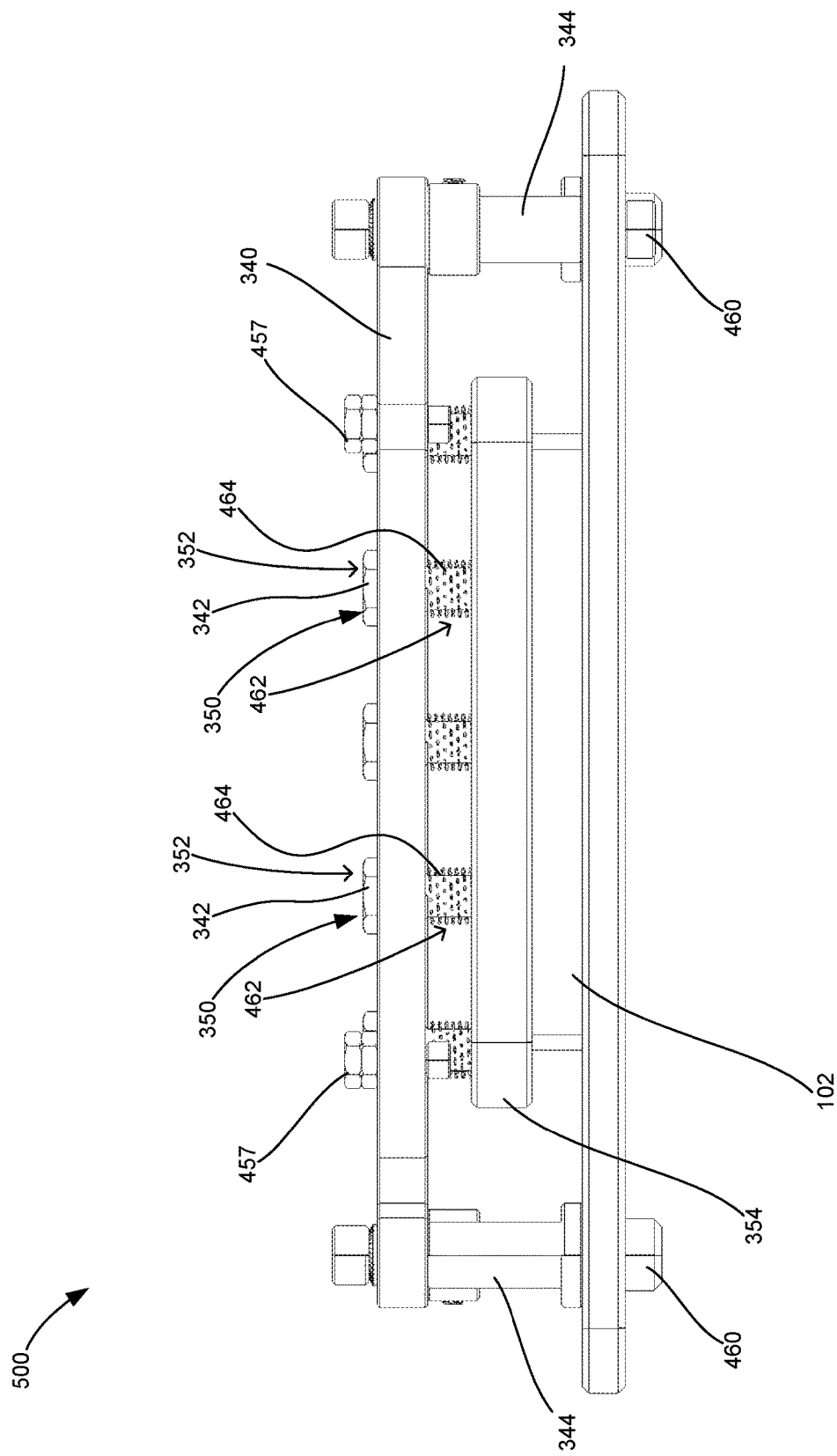
FIG. 5 illustrates a side perspective view of the compression-loading assembly of FIG. 4 according to aspects of the disclosure.

FIG. 5 illustrates a side perspective view of a compression-loading assembly 500. The assembly 500 may be similar to assembly 400, described with respect to FIG. 3 and, therefore, the same or similar reference numbers may be used to describe similar components. The compression-loading assembly 500 may include top plate 340, compression plate 354, a stiffener 466, one or more compression mechanisms 350, one or more alignment studs 344, one or more threaded members 460 for coupling the PCB 106 to the alignment studs 344, and ASIC 102. The compression mechanisms 350 may include a bolt 352 and a spring 462.

As discussed above, the top plate 340 may be coupled to PCB 106 via the alignment studs 344. A threaded member 460 may be inserted through a bore in the PCB 106 and into a threaded bore of the alignment stud 344. Thus, the threaded member 460 threadably couples the PCB 106 to top plate 340.

As shown, each spring 462 of the compression mechanism 350 may be located between the top plate 340 and compression plate 354. The springs 462 may exert a compression force, or a compression load, on the compression plate and, therefore, on ASIC 102. The compression load may be adjusted by rotating bolt 352. For example, tightening bolt 352 may compress spring 462. The greater the compression of spring 462, the greater the force exerted by spring 462 on compression plate 354. On the contrary, loosening bolt 352 may decompress spring 462. The less compressed spring 462 is, the less force is exerted by spring 462 on compression plate 354. Thus, the compression load created by the compression mechanisms may be adjustable based on the specifications needed for manufacturing of the ASIC package.

According to some examples, the assembly 500, as shown, has the PCB 106 as the bottom layer and the top plate 340 as the top layer. When the assembly 500 is flipped, such that the PCB 106 is the top layer and the top plate 340 is the bottom layer, the assembly 500 may retain the solder joints during the reflow process.

For example, during the reflow process, the metal of the VIPPO structure may heat first due to the metal throughout the via. As discussed earlier, the metal in the via of the VIPPO structure may have a lower "out-of-plane" or z-axis CTE than non-VIPPO and deep-backdrilled VIPPO structures. In comparison, non-VIPPO and deep-backdrilled VIPPO structures may have a higher "out-of-plane" CTE than the VIPPO-structure due to less metal, or no metal, being located within the via. In some examples, the solder joints above the VIPPO structures may become liquidus before the solder joints above the non-VIPPO and/or deep-backdrilled VIPPO structures such that the solder joints above the non-VIPPO and/or deep-backdrilled VIPPO may remain solid. As the non-VIPPO and the deep-backdrilled VIPPO structures are heated, the package substrate is pushed outward, which may weaken or disconnect the VIPPO structures. Once the non-VIPPO and the deep-backdrilled VIPPO are fully liquid, the strain may be removed from the VIPPO structures. Thus, the compression-loading assembly 500 may be used to remove and/or reduce the strain on the solder joints above the VIPPO structures while the solder joints above the non-VIPPO and the deep-backdrilled VIPPO structures liquefy. The uniform compression load exerted by the compression mechanisms 350 may retain the liquefied solder joints above the VIPPO structure while the solder joints above the non-VIPPO and the deep-backdrilled VIPPO structures liquefy. In some examples, the compression load may prevent the solder joints above the VIPPO structures from separating between the bulk solder and the IMC at the BGA pad. Additionally or alternatively, the compression load may overcome, or be greater than, the tension force that causes the solder separation defect.

The compression-loading assembly 500 may have a thermal mass that does not significantly impact the reflow profile of the power module. Additionally or alternatively, the compression-loading system 500 may withstand up to 245 degrees Celsius for a tin-silver-copper (SAC) reflow profile without introducing warpage effects to the ASIC solder joints. The ASIC solder joints may be the solder joints between the PCB and the ASIC.

Figure 6:
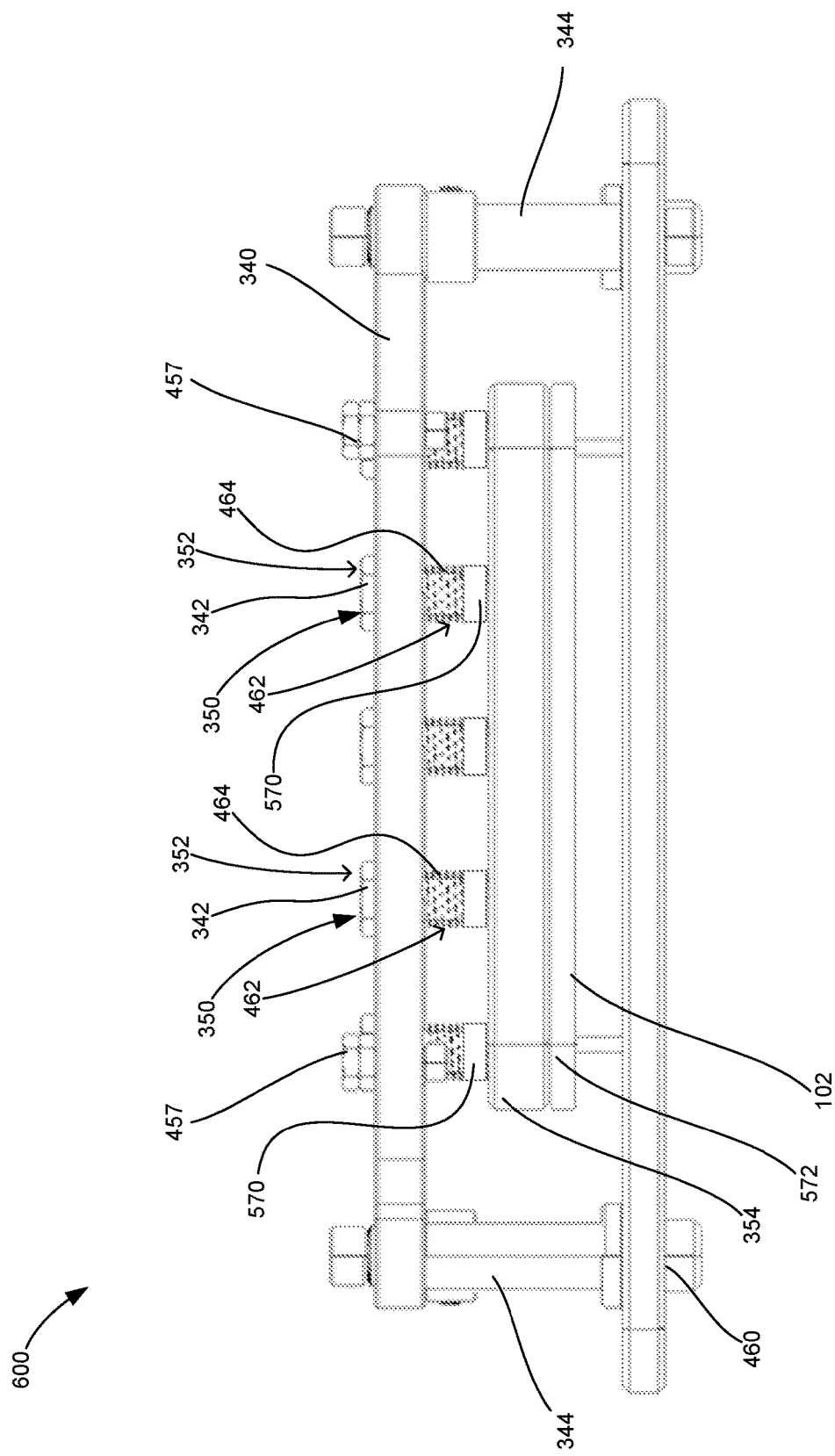
FIG. 6 illustrates a side perspective view of a compression-loading assembly according to aspects of the disclosure.

FIG. 6 is a side perspective view of a compression loading assembly 600. FIG. 6 is substantially similar to FIG. 5 but further includes a plurality of protrusions 570 extending away from compression plate 354 and towards top plate 340 as well as a stiffener 572 positioned between compression plate 354 and ASIC 102.

Compression plate 354 may have a plurality of protrusions 570. The protrusions 570 may be used to couple or align top plate 340 with compression plate 354. For example, each protrusion may have a threaded bore with threads configured to mate with the threads of bolt 352. Thus, the threaded bore of each protrusion 570 may threadably receive bolt 352. Threading bolt 352 into a protrusion 570 thereby couples compression plate 354 and top plate 340. According to some examples, the further each bolt 352 is threaded into each protrusion 570, the greater the compression load each spring 462 exerts on the compression plate 354.

As shown, each spring 462 of the compression mechanism 350 may be located between the top plate 340 and compression plate 354. The springs 462 may exert a compression force, or a compression load, on the compression plate 354 which subsequently exerts a force on the stiffener 572 while also exerting a force on ASIC BGA package 182, including ASIC die 102. Stiffener 572 may be made of silicone and configured to absorb impact such that a uniform compression load is exerted on ASIC BGA package 182. According to some examples, stiffener 572 may be a protective layer between compression plate 354 and ASIC die 102. As a protective layer, stiffener 572 may protect the fragile components of ASIC die 102 from being broken by the hard compression plate 354.

The compression-loading assembly may be used in examples other than those disclosed herein. For example, the compression-loading assembly may be used when soldering adjacent structures. In particular, due to different structures having different CTE and thermal conductivity, it may be necessary to use the compression-loading assembly to prevent the solder separation defect from occurring. Thus, the compression-loading assembly may be used in other applicable situations other than the secondary reflow process.

Although the examples described herein refer to an ASIC package and a power module, the compression-load assembly can be used with other components that attach to a substrate package such as an integrated circuit, system on a chip, memory, etc. For example, the compression-loading assembly may be used to attach any two separate components such that two BGA packages are mounted back to back. Therefore, references to ASIC packages and power modules herein are for illustration only and are not meant to be limiting.

Unless otherwise stated, the foregoing alternative examples are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same reference numbers in different drawings can identify the same or similar elements.

The invention claimed is:

1. A compression-loaded assembly for applying a compression force on ball grid array ("BGA") package, the compression-loaded assembly comprising:
    a top plate;
    a compression plate; and
    one or more compression mechanisms releasably coupled to the top plate and extending in a direction toward the compression plate, wherein the one or more compression mechanisms configured to apply a compression load on the BGA package in a direction away from the top plate towards the compression plate,
    wherein each compression mechanism includes a compression member that is at least partially threaded and configured to be threadably coupled with the compression plate, and
    wherein the one or more compression mechanisms can be threadably advanced or retracted such that the compression load is adjustable.

2. The compression-loaded assembly of claim 1, wherein when the one or more compression mechanisms are advanced the compression load is increased.

3. The compression-loaded assembly of claim 1, wherein when the one or more compression mechanisms are retracted the compression load is decreased.

4. The compression-loaded assembly of claim 1, wherein the one or more compression mechanisms includes at least six compression mechanisms.

5. The compression-loaded assembly of claim 4, wherein the at least six compression mechanisms are distributed on the compression plate.

6. The compression-loaded assembly of claim 1, wherein the one or more compression mechanisms are configured to provide a uniform compression load across the BGA package.

7. The compression-loaded assembly of claim 1, wherein each compression mechanism includes at least one spring positioned on each compression member.

8. The compression-loaded assembly of claim 2, wherein the at least one spring is located between the compression plate and the top plate.

9. The compression-loaded assembly of claim 2, wherein each compression member includes a head and a shaft.

10. The compression-loaded assembly of claim 9,
    wherein the top plate includes one or more counterbores, and
    wherein the one or more counterbores are configured to receive the head of the compression member.

11. The compression-loaded assembly of claim 9,
    wherein the compression plate include one or more throughbores, and
    wherein the one or more throughbores are configured to receive the shaft of the compression member.

12. The compression-loaded assembly of claim 9, wherein the head of the compression member is located on a first side of the top plate and the at least one spring is located on a second side of the top plate opposite the first side.

13. The compression-loaded assembly of claim 2, wherein the at least one spring is configured to dampen vibrations.

14. The compression-loaded assembly of claim 1, further comprising one or more coupling mechanisms extending from the top plate, the one or more coupling mechanisms configured to releasably couple the top plate to a component, wherein each of the one or more coupling mechanisms includes an alignment stud integral with the top plate and a threaded member.

15. The compression-loaded assembly of claim 14, wherein the component is a printed circuit board ("PCB").

16. The compression-loaded assembly of claim 15, wherein the PCB includes at least one PCB throughbore that aligns with a threaded bore of the alignment stud, the at least one PCB throughbore and the threaded bore of the alignment stud configured to receive the threaded member.

17. A compression-loaded assembly for applying a compression force on ball grid array ("BGA") package, the compression-loaded assembly comprising:
    a top plate;
    a compression plate; and
    one or more compression mechanisms adjustably coupled to the top plate and extending in a direction toward the compression plate,
    wherein each of the one or more compression mechanisms includes a threaded compression member and at least one spring positioned on each compression member,
    wherein each of the threaded compression members is configured to be threadably coupled with the compression plate,
    wherein when each of the threaded compression members is rotated in a first direction, the one or more compression mechanisms are configured to apply a first compression load on the BGA package in a direction away from the top plate towards the compression plate, and
    wherein when each of the threaded compression members if rotated in a second direction, the one or more compression mechanisms are configured to apply a second compression load on the BGA package in a direction away from the top plate toward the compression plate, the second compression load being less than the first compression load.

18. The compression-loaded assembly of claim 17, further comprising one or more coupling mechanisms extending from the top plate, the one or more coupling mechanisms configured to releasably couple the top plate to a component, wherein each of the one or more coupling mechanisms includes an alignment stud integral with the top plate and a threaded member.

19. A compression-loaded assembly for applying a compression force on ball grid array ("BGA") package, the compression-loaded assembly comprising:
    a top plate;
    a compression plate; and
    one or more compression mechanisms releasably coupled to the top plate and extending in a direction toward the compression plate, wherein the one or more compression mechanisms configured to apply a compression load on the BGA package in a direction away from the top plate towards the compression plate,
    wherein each compression mechanism includes a compression member that is at least partially threaded and configured to be threadably coupled with the compression plate, and
    wherein each compression mechanism includes at least one spring positioned on each compression member.

20. The compression-loaded assembly of claim 19, wherein the at least one spring is located between the compression plate and the top plate.

* * * * *